United States Patent
Qian et al.

(10) Patent No.: US 8,989,522 B2
(45) Date of Patent: Mar. 24, 2015

(54) ISOLATION OF COMPONENTS ON OPTICAL DEVICE

(75) Inventors: Wei Qian, Torrance, CA (US); Dazeng Feng, El Monte, CA (US); Mehdi Asghari, Pasadena, CA (US); Joan Fong, San Marino, CA (US)

(73) Assignee: Kotura, Inc., Monetery Park, CA (US)

( * ) Notice: Subject to any disclaimer, the term of this patent is extended or adjusted under 35 U.S.C. 154(b) by 175 days.

(21) Appl. No.: 13/506,705

(22) Filed: May 9, 2012

(65) Prior Publication Data

US 2013/0301979 A1   Nov. 14, 2013

(51) Int. Cl.
| | | |
|---|---|---|
| G02F 1/035 | (2006.01) |
| H01L 31/105 | (2006.01) |
| G02B 6/12 | (2006.01) |
| G02F 1/01 | (2006.01) |
| G02F 1/025 | (2006.01) |
| G02F 1/03 | (2006.01) |
| G02F 1/225 | (2006.01) |

(52) U.S. Cl.
CPC ............ *H01L 31/105* (2013.01); *G02F 1/0147* (2013.01); *G02F 1/025* (2013.01); *G02F 1/0305* (2013.01); *G02F 1/225* (2013.01); *G02F 2201/063* (2013.01); *G02F 2201/501* (2013.01)
USPC ................................................ 385/2; 385/14

(58) Field of Classification Search
USPC .......................................................... 385/1–3
See application file for complete search history.

(56) References Cited

U.S. PATENT DOCUMENTS

| | | | | |
|---|---|---|---|---|
| 6,108,481 | A  * | 8/2000 | Tohyama et al. | 385/131 |
| 6,374,001 | B1   | 4/2002 | Bozeat et al. | |
| 6,853,793 | B1 * | 2/2005 | van der Vliet et al. | 385/130 |
| 7,167,605 | B2 * | 1/2007 | Chang et al. | 385/2 |
| 7,599,596 | B1 * | 10/2009 | Feng et al. | 385/132 |
| 8,053,790 | B2 * | 11/2011 | Feng et al. | 257/85 |
| 8,093,080 | B2 * | 1/2012 | Liao et al. | 438/38 |
| 8,346,028 | B2 * | 1/2013 | Feng et al. | 385/8 |
| 8,410,566 | B2 * | 4/2013 | Qian et al. | 257/432 |
| 8,411,260 | B1 * | 4/2013 | Feng et al. | 356/73.1 |
| 8,476,576 | B2 * | 7/2013 | Dong et al. | 250/227.24 |
| 8,515,214 | B1 * | 8/2013 | Liao et al. | 385/2 |
| 8,542,954 | B2 * | 9/2013 | Kung et al. | 385/2 |
| 8,638,485 | B2 * | 1/2014 | Feng et al. | 359/238 |
| 8,817,354 | B2 * | 8/2014 | Feng et al. | 359/245 |
| 2005/0214989 | A1 | 9/2005 | Keyser | |
| 2010/0207223 | A1 | 8/2010 | Feng et al. | |
| 2011/0068425 | A1 * | 3/2011 | Liao et al. | 257/432 |
| 2011/0091146 | A1 * | 4/2011 | Knights et al. | 385/2 |
| 2011/0142390 | A1 * | 6/2011 | Feng et al. | 385/2 |
| 2011/0194803 | A1 * | 8/2011 | Shin et al. | 385/3 |
| 2011/0310467 | A1 | 12/2011 | Feng et al. | |
| 2012/0263410 | A1 | 10/2012 | Feng et al. | |
| 2013/0020664 | A1 * | 1/2013 | Qian et al. | 257/432 |
| 2013/0020668 | A1 * | 1/2013 | Qian et al. | 257/432 |
| 2013/0182305 | A1 * | 7/2013 | Feng et al. | 359/245 |
| 2013/0195398 | A1 * | 8/2013 | Liao et al. | 385/14 |

(Continued)

*Primary Examiner* — Rhonda Peace
(74) *Attorney, Agent, or Firm* — Gavrilovich, Dodd & Lindsey, LLP

(57) ABSTRACT

The optical device includes an active component on a base. The active component is a light sensor and/or a light modulator. The active component including an active medium that includes a ridge and slab regions. The ridge extends upwards from the base and is positioned between the slab regions. The ridge defines a portion of a waveguide on the base. One or more isolation trenches each extends into the slab regions of the active medium and is at least partially spaced apart from the ridge of the active medium.

23 Claims, 11 Drawing Sheets

(56) References Cited

U.S. PATENT DOCUMENTS

| | | | |
|---|---|---|---|
| 2013/0229701 A1* | 9/2013 | Feng et al. | 359/278 |
| 2013/0294472 A1* | 11/2013 | Feng et al. | 372/50.22 |
| 2013/0301975 A1* | 11/2013 | Spann et al. | 385/3 |
| 2013/0301979 A1* | 11/2013 | Qian et al. | 385/14 |
| 2013/0316484 A1* | 11/2013 | Fong et al. | 438/57 |
| 2014/0113397 A1* | 4/2014 | Qian et al. | 438/57 |

* cited by examiner

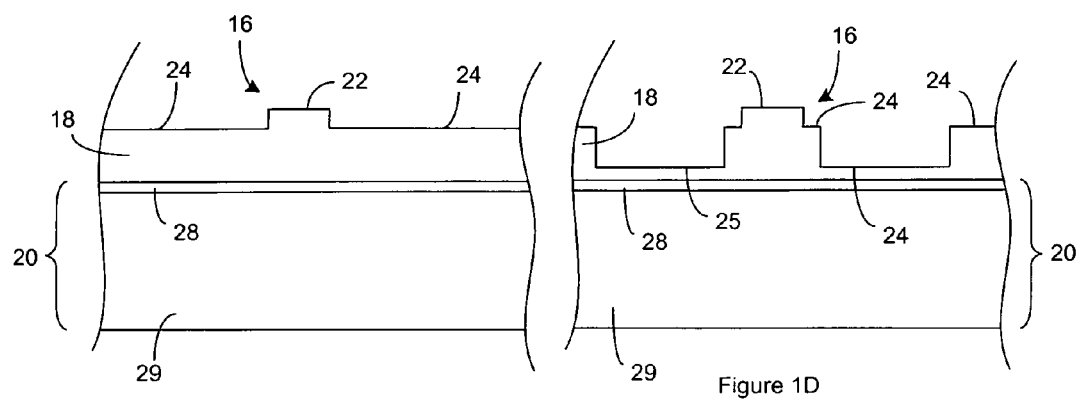
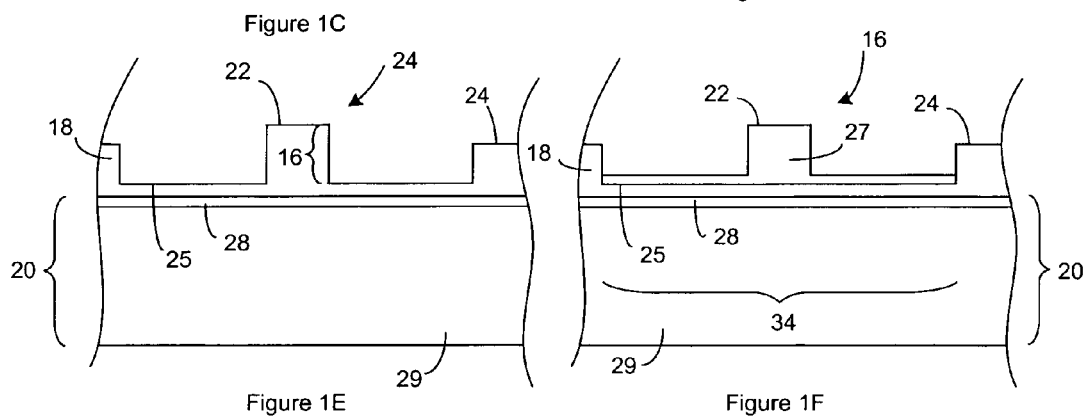
Figure 1C
Figure 1D
Figure 1E
Figure 1F

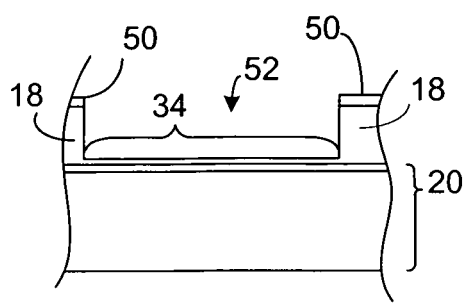
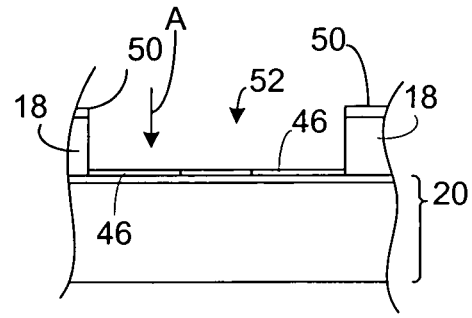
Figure 4A  Figure 4B
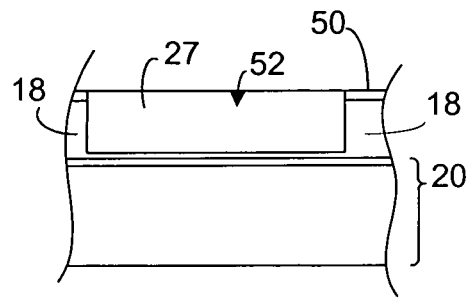
Figure 4C
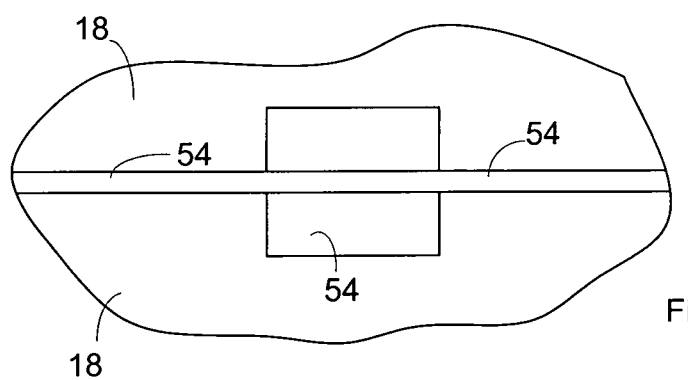
Figure 4D

ISOLATION OF COMPONENTS ON OPTICAL DEVICE

FIELD

The present invention relates to optical devices and more particularly to isolation of optical components on an optical device.

BACKGROUND

A variety of optical devices include an active component such as a light sensor or modulator. These active components typically guide a light signal through a component waveguide while an electrical field is applied to the component waveguide. The component waveguide can be partially defined by a ridge that extends upwards from slab regions. The performance of these components can be adversely affected by the presence of stray light signals from other components being present in the slab regions. Additionally or alternately, these components can be adversely affected when thermal energy from other components on the device travels through the device to the component. As a result, there is often a need to thermally, electrically, and/or optically isolate these components from other components on the same device.

SUMMARY

The optical device includes an active component on a base. The active component is a light sensor and/or a light modulator. The active component including an active medium that includes a ridge and slab regions. The ridge extends upwards from the base and is positioned between the slab regions. The ridge defines a portion of a waveguide on the base. One or more isolation trenches each extends into the slab regions of the active medium and is at least partially spaced apart from the ridge.

A method of forming an optical device that includes an active component that acts as a light sensor and/or modulator is also disclosed. The method includes performing a device waveguide etch on a device having a light transmitting-medium on a base. The device waveguide etch defines a device waveguide in the light-transmitting medium. The method also includes performing a component waveguide etch on the device. The component waveguide etch defines a component waveguide on the device. The device waveguide and the component waveguide are aligned so as to be different portions of a common waveguide in which the device waveguide portion exchanges light signals with the component waveguide portion. The method also includes forming isolation trenches on the device such that each isolation trench extends into the slab regions of the active medium and is at least partially spaced apart from the ridge. The one or more isolation trenches are fully or partially formed by one or more etches selected from the device waveguide etch and the component waveguide etch.

In some instances, one or more of the isolation trenches and the waveguide together define a perimeter that surrounds at least a portion of the active component. In one example, one or more of the isolation trenches and the waveguide together define a perimeter that surrounds at least a portion of a slab region of the active medium.

BRIEF DESCRIPTION OF THE FIGURES

FIG. 1A through FIG. 1G illustrate an optical device having an active component configured to operate as a modulator and/or a light sensor. FIG. 1A is a perspective view of the device.

FIG. 1B is a topview of the portion of the optical device shown in FIG. 1A that includes an optical modulator.

FIG. 1C is a cross-section of the device shown in FIG. 1B taken along the line labeled C.

FIG. 1D is a cross-section of the optical device shown in FIG. 1B taken along the line labeled D.

FIG. 1E is a cross-section of the optical device shown in FIG. 1B taken along the line labeled E.

FIG. 1F is a cross-section of the optical device shown in FIG. 1B taken along the line labeled F.

FIG. 1G is a cross-section of the optical device shown in FIG. 1B taken along the line labeled G.

DESCRIPTION

Figure 1A:
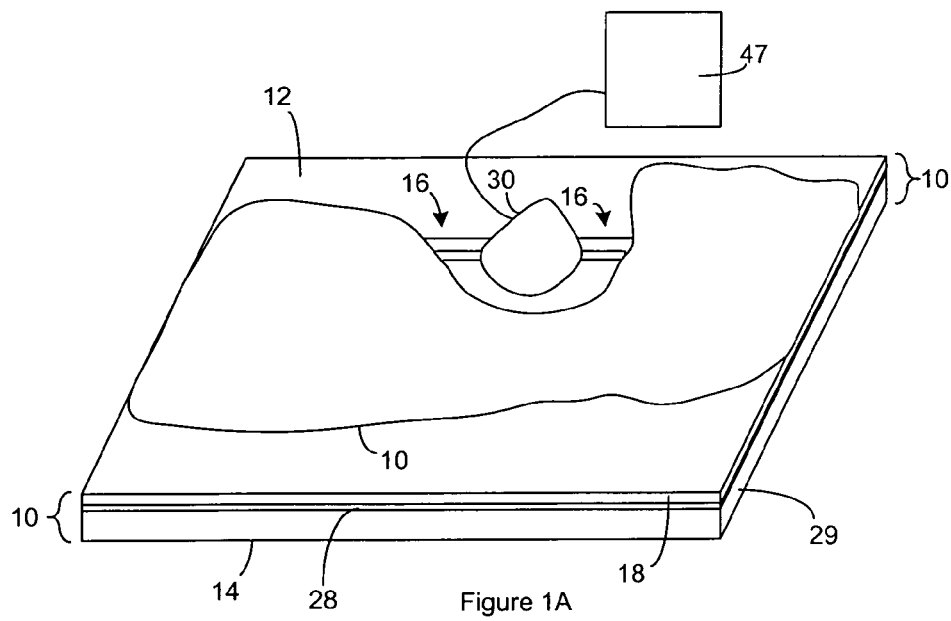

An optical device is disclosed that includes a common waveguide and an active component positioned on a base. The active component serves as a light sensor and/or light modulator. The active component includes an active medium that provides the light sensor and/or light modulator with the desired functionality. The common waveguide guides light signals through the device. A portion of the common waveguide is a device waveguide that is formed in a light-transmitting medium. Another portion of the common waveguide is a component waveguide that guides the light signals through the active medium in the active component.

The device includes isolation trenches that extend into or through the active medium. In some instances, the isolation trenches are arranged so the common waveguide and the isolation trenches define a perimeter that surrounds a portion of the active component. In some instances, the isolation trenches together with the common waveguide define a perimeter that surrounds the active component. Since the isolation trenches extend into or through the active medium and can surround the active component, they prevent or reduce the entry of stray light signals from other regions of the device into the active component. Additionally or alternately, the isolation trenches prevent or reduce the entry of stray thermal energy and/or stray electrical energy into the active component. Additionally or alternately, in some instances, the active component generates desirable heat and/or includes one or more heaters for the generation of heat. The isolation trenches can prevent or reduce the loss of the generated thermal energy from the active component. Additionally or alternately, the isolation trenches can prevent or reduce the escape of electrical energy from the active component.

Additionally, experimental results have shown that these isolation trenches provide a surprising increase in speed and reduction in the level of dark current associated with the active component. In particular, the inventors have found one embodiment of the active component without the isolation trenches shows an average dark current of around 0.9 µA at 1V; however, when the isolation trenches were applied to the same embodiment, the dark current dropped to an average of less than 0.2 µA at 1V. Without being bound to theory, the improvements in speed and dark current are believed to result from the isolation trenches reducing the parasitic capacitance and parasitic current associated with the active component. Accordingly, the isolation trenches not only provide isolation to/from external influences but also provide substantial improvements in performance of the optical component. As a result, the isolation trenches serve to do more than merely isolate the active component from other components. As a result, the isolation trenches are also preferable when other components are not present on the device.

It is generally desirable for the isolation trenches to extend more deeply into the device than many of the other features of the device. As a result, it may be desirable to use a separate etch for the formation of the isolation trenches. However, the inventors have found a method of using an etch that forms the device waveguide and/or an etch that forms the component waveguide to also form the isolation trenches. Additionally, this method provides precise alignment of the device waveguide and the component waveguide. As a result, the presence of these isolation trenches does not add substantial complexity or costs to the fabrication process.

Figure 1B:
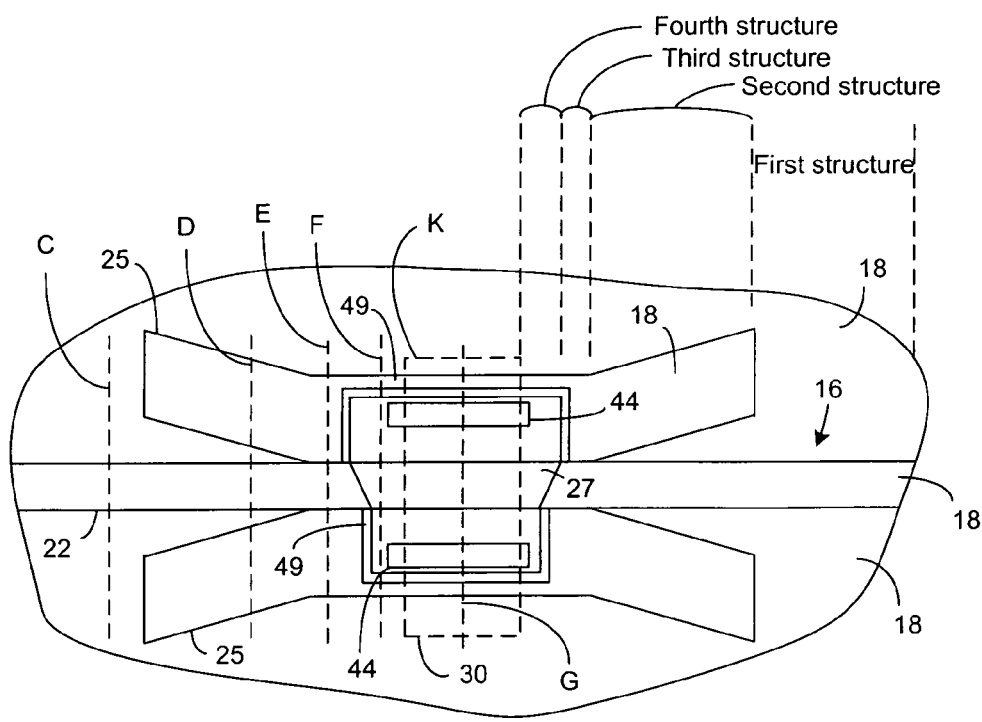
Figure 1G:
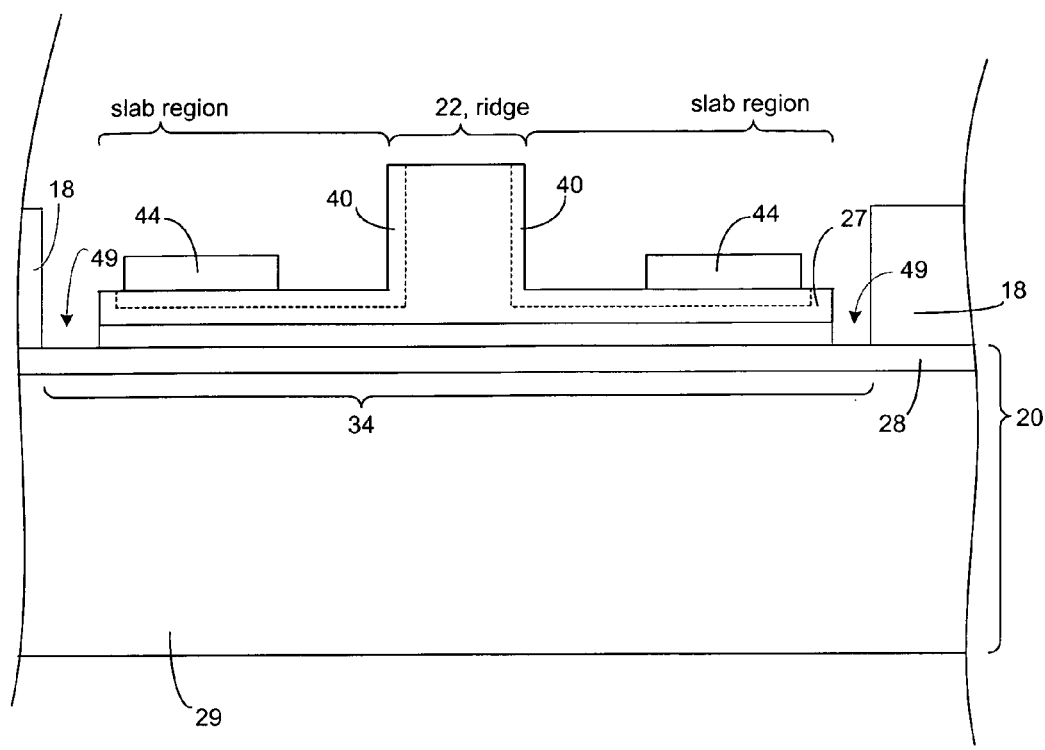

FIG. 1A through FIG. 1G illustrate an optical device having a waveguide that includes an active component. FIG. 1A is a perspective view of the device. FIG. 1B is a topview of the portion of the optical device shown in FIG. 1A that includes an active component. FIG. 1C is a cross-section of the device shown in FIG. 1A taken along the line labeled C. FIG. 1D is a cross-section of the optical device shown in FIG. 1A taken along the line labeled D. FIG. 1E is a cross-section of the optical device shown in FIG. 1A taken along the line labeled E. FIG. 1F is a cross-section of the optical device shown in FIG. 1A taken along the line labeled F. FIG. 1G is a cross-section of the optical device shown in FIG. 1A taken along the line labeled G.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the topside of the base, the bottom side of the base, the topside of the substrate, and/or the bottom side of the substrate.

The illustrated device includes lateral sides 10 (or edges) extending from a topside 12 to a bottom side 14. The propagation direction of light signals along the length of the waveguides on a planar optical device generally extends through the lateral sides 10 of the device. The topside 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, modulators that convert a light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

A portion of the waveguide 16 includes a first structure where a portion of the waveguide 16 is defined in a light-transmitting medium 18 positioned on a base 20. For instance, a portion of the waveguide 16 is partially defined by a ridge 22 extending upward from a slab region of the light-transmitting medium 18 as shown in FIG. 1C. In some instances, the top of the slab region is defined by the bottom of trenches 24 extending partially into the light-transmitting medium 18 or through the light-transmitting medium 18. Suitable light-transmitting media include, but are not limited to, silicon, polymers, silica, SiN, GaAs, InP and $LiNbO_3$. One or more cladding layers (not shown) are optionally positioned on the light-transmitting medium 18. The one or more cladding layers can serve as a cladding for the waveguide 16 and/or for the device. When the light-transmitting medium 18 is silicon, suitable cladding layers include, but are not limited to, silicon, polymers, silica, SiN, GaAs, InP and $LiNbO_3$.

Recesses 25 (FIG. 1B) extend into the slab regions such that the ridge 22 is positioned between recesses 25. The recesses 25 can extend only part way into the light-transmitting medium 18 (FIG. 1D) or all the way through the light-transmitting medium 18. As is evident from FIG. 1D, the recesses 25 can be spaced apart from the ridge 22. As a result, a portion of the waveguide 16 includes a second structure where an upper portion of the waveguide 16 is partially defined by the ridge 22 extending upward from the slab region and a lower portion of the waveguide 16 is partially defined by recesses 25 extending into the slab regions and spaced apart from the ridge 22.

As shown in FIG. 1E, the recesses 25 can approach the ridge 22 such that the sides of the ridge 22 and the sides of the recesses 25 combine into a single surface 26. As a result, a portion of a waveguide 16 includes a third structure where the waveguide 16 is partially defined by the surface 26.

As is evident in FIG. 1B, a portion of the waveguide 16 includes an active medium 27 such as an electro-absorption medium. The active medium 27 is configured to receive the light signals from a portion of the waveguide 16 having the third structure and to guide the received light signals to another portion of the waveguide 16 having the third structure.

In FIG. 1F, a ridge 22 of active medium 27 extends upward from a slab region of the active medium 27. Accordingly, a portion of the waveguide 16 includes a fourth structure that serves as a component waveguide 23. The component waveguide 23 is partially defined by the top and lateral sides of the active medium 27. The slab regions of the active medium 27 and the ridge 22 of the active medium 27 are both positioned on a seed portion 34 of the light-transmitting medium 18. As a result, the seed portion 34 of the light-transmitting medium 18 is between the active medium 27 and the base 20.

As is evident in FIG. 1B, there is an interface between each facet of the active medium 27 and a facet of the light-transmitting medium 18. The seed portion 34 of the light-transmitting medium 18 can be continuous with the light transmitting medium included in the waveguide 16 and can extend under the interface. As a result, when the light signal travels from the light-transmitting medium 18 into the active medium 27, a portion of the light signal enters the seed portion 34 of the light-transmitting medium 18 and another portion of the light signal enters the active medium 27. As described above, the active medium 27 can be grown on the seed portion of the light-transmitting medium 18.

The interface between the facet of the active medium 27 and the facet of the light-transmitting medium 18 can have an angle that is non-perpendicular relative to the direction of propagation of light signals through the waveguide 16. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 28 with a lower index of refraction than the light-transmitting medium 18. The drop in the index of refraction can cause reflection of a light signal from the light-transmitting medium 18 back into the light-transmitting medium 18. The base 20 can include the optical insulator 28 positioned on a substrate 29. As will become evident below, the substrate 29 can be configured to transmit light signals. For instance, the substrate 29 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the optical insulator 28 and the silicon substrate can serve as the substrate 29.

The optical device includes an active component 30 such as a modulator and/or light sensor. The location of the modulator on the optical device is illustrated by the line labeled K in FIG. 1B. In order to simplify FIG. 1B, the details of the modulator construction are not shown in FIG. 1B. However, the modulator construction is evident from other illustrations such as FIG. 1G. The modulator of FIG. 1G is constructed on the portion of the waveguide 16 having a fourth structure constructed according to FIG. 1F. The perimeter of portions of doped regions shown in FIG. 1G are illustrated with dashed lines to prevent them from being confused with interfaces between different materials. The interfaces between different materials are illustrated with solid lines. The modulator is configured to apply an electric field to the active medium 27 in order to phase and/or intensity modulate the light signals received by the modulator.

A ridge 22 of the active medium 27 extends upward from a slab region of the active medium 27. Doped regions 40 are both in the slab regions of the active medium 27 and also in the ridge 22 of the active medium 27. For instance, doped regions 40 of the active medium 27 are positioned on the lateral sides of the ridge 22 of the active medium 27. In some instances, each of the doped regions 40 extends up to the topside of the active medium 27 as shown in FIG. 1G. Additionally, the doped regions 40 extend away from the ridge 22 into the slab region of the active medium 27. The transition of a doped region 40 from the ridge 22 of the active medium 27 into the slab region of the active medium 27 can be continuous and unbroken as shown in FIG. 1G.

Each of the doped regions 40 can be an N-type doped region or a P-type doped region. For instance, each of the N-type doped regions can include an N-type dopant and each of the P-type doped regions can include a P-type dopant. In some instances, the active medium 27 includes a doped region 40 that is an N-type doped region and a doped region 40 that is a P-type doped region. The separation between the doped regions 40 in the active medium 27 results in the formation of PIN (p-type doped region-intrinsic region-n-type doped region) junction in the modulator 30.

Electrical conductors 44 are positioned on the slab region of the active medium 27. In particular, the electrical conductors 44 each contact a portion of a doped region 40 that is in the slab region of the active medium 27. Accordingly, the each of the doped regions 40 is doped at a concentration that allows it to provide electrical communication between an electrical conductor 44 and one of the doped regions 40 in the active medium 27. As a result, electrical energy can be applied to the electrical conductors 44 in order to apply the electric field to the active medium 27. The region of the light-transmitting medium 18 or active medium between the doped regions can be undoped or lightly doped as long as the doping is insufficient for the doped material to act as an electrical conductor that electrically shorts the active component.

Figure 2:
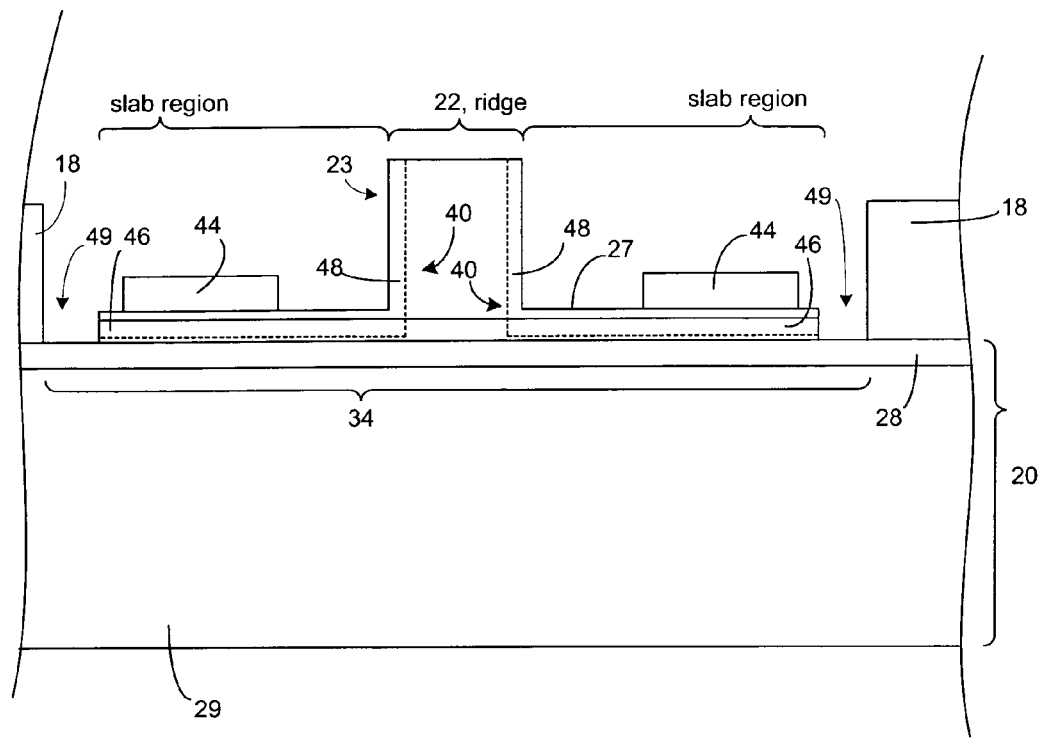
FIG. 2 is a cross section of an embodiment of an alternative embodiment of an active component and can represent a cross section of the device shown in FIG. 1B taken along the line labeled G.

Modulators and/or light sensors having a cross section according to 1G can be used in configurations other than the configuration of FIG. 1A through 1F. Additional details about the fabrication, structure and operation of a modulator having a cross section according to FIG. 1G can be found in U.S. patent application Ser. No. 12/653,547, filed on Dec. 15, 2009, entitled "Optical Device Having Modulator Employing Horizontal Electrical Field," and incorporated herein in its entirety. Additional details about the fabrication, structure and operation of a light sensor having a cross section according to FIG. 1G can be found in U.S. Patent Application No. 61/572,841, filed on Jul. 21, 2011, entitled "Optical Device Having Light Sensor with Doped Regions;" and also in U.S. patent application Ser. No. 13/136,828, filed on Aug. 10, 2011, entitled "Application of Electrical Field Power to Light-transmitting medium 18," each of which is incorporated herein in its entirety, FIG. 2 presents another embodiment of an active component and can represent a cross section of the device shown in FIG. 1B taken along the line labeled G. The perimeter of portions of doped regions shown in FIG. 2 are illustrated with dashed lines to prevent them from being confused with interfaces between different materials. The interfaces between different materials are illustrated with solid lines. A first doped zone 46 and a second doped zone 48 combine to form each of the doped regions 40. In some instance, the first doped zone 46 is located in the light-transmitting medium 18 but not in the active medium 27 and the second doped zone 48 is located in the active medium 27. The first doped zone 46 can contact the second doped zone 48 or can overlap with the second doped zone 48. In some instances, the first doped zone 46 and the second doped zone 48 overlap and at least a portion of the overlap is located in the light-transmitting medium 18. In other instances, the first doped zone 46 and the second doped zone 48 overlap without any overlap being present in the active medium 27.

The first doped zone 46 and the second doped zone 48 included in the same doped region 40 each includes the same type of dopant. For instance, the first doped zone 46 and the second doped zone 48 in an n-type doped region 40 each includes an n-type dopant. The first doped zone 46 and the second doped zone 48 included in the same doped region 40 can have the same dopant concentration or different concentrations.

Although FIG. 2 illustrates the slab regions of the active medium 27, the slab regions of the active medium 27 may not be present. For instance, the etch that forms the slab regions of the active medium 27 may etch all the way through the slab regions. In these instances, the first doped zone 46 and the second doped zone 48 are both formed in the light-transmitting medium 18.

Although FIG. 2 shows the first doped zone 46 not extending down to the optical insulator 28, the first doped zone 46 can extend down to the optical insulator 28 or into the optical insulator 28.

The optical device of FIG. 2 can be constructed using fabrication technologies that are employed in the fabrication of integrated circuits, optoelectronic circuits, and/or optical devices.

Figure 3:
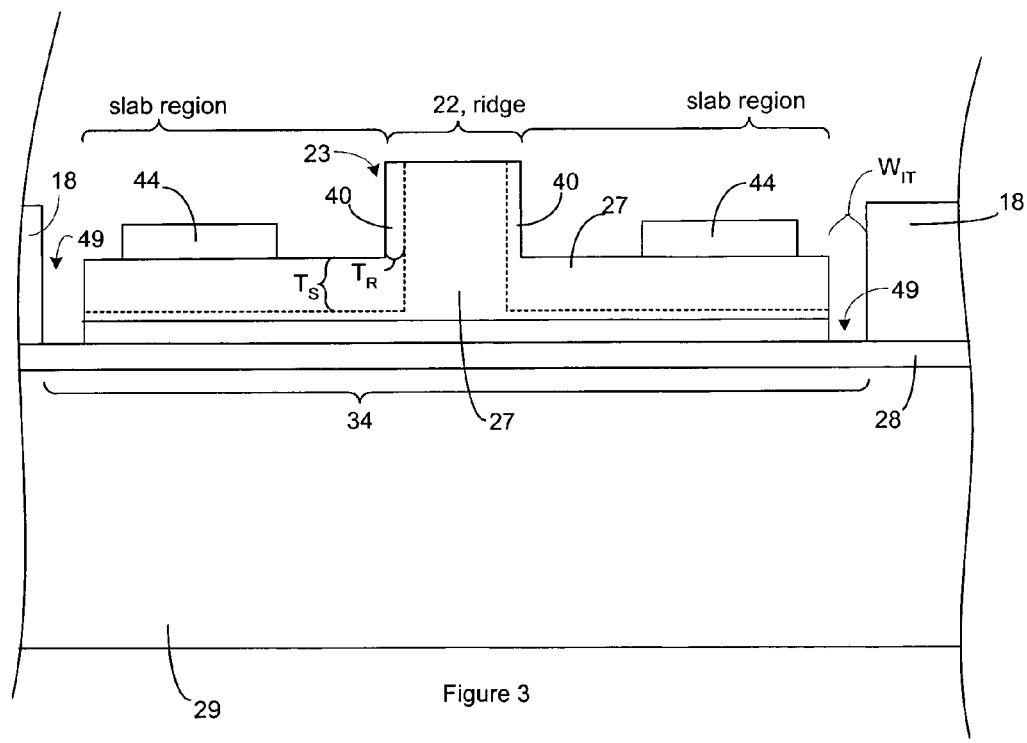
FIG. 3 is a cross section of an embodiment of an alternative embodiment of an active component and can represent a cross section of the device shown in FIG. 1B taken along the line labeled G.

FIG. 3 is a cross section of an embodiment of an alternative embodiment of an active component and can represent a cross section of the device shown in FIG. 1B taken along the line labeled G. The perimeter of portions of doped regions shown in FIG. 3 are illustrated with dashed lines to prevent them from being confused with interfaces between different materials. The interfaces between different materials are illustrated with solid lines.

The doped regions 40 each includes a portion that extends into the ridge 22 of active medium 27 and another portion that extends into the slab region of the active medium 27. The doped region 40 extends further into the slab region of the active medium than the doped region extends into the ridge 22 of the active medium. For instance, the portion of each doped region 40 in the slab region of the active medium 27 is thicker than the portion in the ridge 22. Reducing the extension of the doped region into the ridge 22 reduces the interaction between the doped region and a light signal being guided through the ridge 22. As a result, a reduced extension of the doped region into the ridge 22 reduces optical loss. Extending the doped region further into the slab regions allows the electrical field formed between the doped regions to move closer to the base 20. As a result, the extension of the doped regions further into the slab increases the portion of the light signal that interacts with the electrical field. Accordingly, problems associated with increasing the thickness of the slab regions are reduced because they can be addressed by extending the doped regions 40 further into the slab regions.

A suitable thickness for the portion of the doped region 40 in the ridge (labeled $T_R$ in FIG. 3) includes a thickness greater than 0.01, 0.075, 0.1, or 0.125 μm and/or less than 0.175, 0.2, or 0.5 μm. A suitable thickness for the portion of the doped region 40 in the slab region of the active medium 27 (labeled $T_S$ in FIG. 3) includes a thickness greater than 0.175, 0.2, or 0.225 μm and/or less than 0.275, 0.3, 0.325, or 0.8 μm. A suitable thickness ratio (ratio of thickness of portion of doped region in the slab region: thickness of portion of doped region in the ridge) includes ratios greater than 1, 1.25, or 1.5 and/or less than 2.0, 2.5, and 3.

The doped regions 40 can each be a result of combining a first doped zone (not shown in FIG. 3) and a second doped zone (not shown in FIG. 3). The first doped zone can be located in the slab region of the active medium and the second doped zone can be located both in the ridge 22 and in the slab region of the active medium 27. The first doped zone and the second doped zone included in the same doped region 40 each includes the same type of dopant. For instance, the first doped zone and the second doped zone in an n-type doped region 40 each includes an n-type dopant. The first doped zone and the second doped zone included in the same doped region can have the same dopant concentration or different concentrations. Additionally, the first doped zone can contact the second doped zone so as to form the doped region 40 or can overlap with the second doped zone 48 so as to form the doped region 40. In some instances, the first doped zone and the second doped zone overlap and at least a portion of the overlap is located in slab region of the active medium 27.

Although FIG. 3 shows the doped region 40 not extending down to the optical insulator 28, the doped region 40 can extend down to the optical insulator 28 or into the optical insulator 28.

During operation of a modulator constructed according to FIG. 1A through FIG. 1G, FIG. 2, or FIG. 3, electronics 47 (FIG. 1A) can be employed to apply electrical energy to the electrical conductors 44 so as to form an electrical field in the active medium 27. For instance, the electronics can form a voltage differential between the field sources. The electrical field can be formed without generating a significant electrical current through the active medium 27. The active medium 27 can be a medium in which the Franz-Keldysh effect occurs in response to the application of the electrical field. The Franz-Keldysh effect is a change in optical absorption and optical phase by an active medium 27. For instance, the Franz-Keldysh effect allows an electron in a valence band to be excited into a conduction band by absorbing a photon even though the energy of the photon is below the band gap. To utilize the Franz-Keldysh effect the active region can have a slightly larger bandgap energy than the photon energy of the light to be modulated. The application of the field lowers the absorption edge via the Franz-Keldysh effect and makes absorption possible. The hole and electron carrier wavefunctions overlap once the field is applied and thus generation of an electron-hole pair is made possible. As a result, the active medium 27 can absorb light signals received by the active medium 27 and increasing the electrical field increases the amount of light absorbed by the active medium 27. Accordingly, the electronics can tune the electrical field so as to tune the amount of light absorbed by the active medium 27. As a result, the electronics can intensity modulate the electrical field in order to modulate the light signal. Additionally, the electrical field needed to take advantage of the Franz-Keldysh effect generally does not involve generation of free carriers by the electric field.

Suitable active media 27 for use in the modulator include electro-absorption media 27 such as semiconductors. However, the light absorption characteristics of different semiconductors are different. A suitable semiconductor for use with modulators employed in communications applications includes $Ge_{1-x}Si_x$ (germanium-silicon) where x is greater than or equal to zero. In some instances, x is less than 0.05, or 0.01. Changing the variable x can shift the range of wavelengths at which modulation is most efficient. For instance, when x is zero, the modulator is suitable for a range of 1610-1640 nm. Increasing the value of x can shift the range of wavelengths to lower values. For instance, an x of about 0.005 to 0.01 is suitable for modulating in the c-band (1530-1565 nm).

The structure illustrated in FIG. 1G, FIG. 2, or FIG. 3 can also be employed as a light sensor. For instance, the active medium 27 can be a light-absorbing medium such as germanium. Accordingly, the number 27 in FIG. 1A through FIG. 1G, FIG. 2, or FIG. 3 can represent a light-absorbing medium. During operation of the light sensor, a reverse bias electrical field is applied across the active medium 27. When the active medium 27 absorbs a light signal, an electrical current flows through the active medium 27. As a result, an electrical current through the light-absorbing medium indicates receipt of a light signal. Additionally, the magnitude of the current can indicate the power and/or intensity of the light signal. Different active media 27 can absorb different wavelengths and are accordingly suitable for use in a light sensor depending on the function of the light sensor. A light-absorbing medium that is suitable for detection of light signals used in communications applications includes, but are not limited to, germanium, silicon germanium, silicon germanium quantum well, GaAs, and InP. Germanium is suitable for detection of light signals having wavelengths in a range of 1300 nm to 1600 nm. In some instance, the electronics can be configured to operate a structure as shown in FIG. 1G as both a modulator and a light detector.

In the active medium 27 or the light-transmitting medium 18, suitable dopants for N-type doped regions include, but are not limited to, phosphorus and/or arsenic. Suitable dopants for P-type doped regions include, but are not limited to, boron. The doped regions 40 are doped so as to be electrically conducting. A suitable concentration for the P-type dopant in a P-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

The active component of FIG. 1G, FIG. 2 and FIG. 3 can be constructed using fabrication technologies that are employed in the fabrication of integrated circuits, optoelectronic circuits, and/or optical devices. Additional details regarding the fabrication, structure and operation of an active component having a cross section according to FIG. 1G, FIG. 2, and/or FIG. 3 can be found in U.S. patent application Ser. No. 13/385,099, filed on Feb. 1, 2012, entitled "Optical Component Having Reduced Dependency on Etch Depth" and in U.S. patent application Ser. No. 13/385,372, filed on Feb. 15, 2012, entitled "Optical Component Having Reduced Dependency on Etch Depth," each of which is incorporated herein in its entirety.

The active component is constructed to have isolation trenches 49 that each extends into the active medium and/or the light-transmitting medium 18. In some instances, the active component is constructed to have isolation trenches 49 that each extends through the active medium and/or the light-transmitting medium 18. In some instances, the active component is constructed to have isolation trenches 49 that each extends through the active medium and the underlying seed portion of the light-transmitting medium 18. Additionally, one or more of the isolation trenches 49 and the waveguide 16 together define a perimeter that surrounds a portion of the active component. Multiple isolation trenches can be stitched together to define the perimeter. For instance, the perimeter can be defined by multiple isolation trenches in combination with the waveguide 16. In one example, one or more of the isolation trenches terminates at the waveguide 16 such that the isolation trenches 49 and the waveguide 16 together define a perimeter that surrounds a portion of the active component. In one example, one or more of the isolation trenches 49 terminates at the waveguide 16 such that the isolation trenches 49 and the waveguide 16 together form a perimeter that surrounds a portion of the active component. In another example, one of the isolation trenches 49 terminates at two different regions the waveguide 16 such that the isolation trenches 49 and the waveguide 16 together form a perimeter that surrounds a portion of the active component. In each of the above cases, the portion of the active component that is surrounded by the perimeter can include one, two, or three features selected from the group consisting of a slab region of the active medium, an electrical conductor 44, and a portion or all of a doped region 40. The portion of the waveguide 16 at which an isolation trench 49 terminates can be the component waveguide 23 and/or the portion of the waveguide 16 defined in the light-transmitting medium 18 (the device waveguide).

The isolation trenches 49 on an active component can be formed such that different perimeters are defined of formed on opposing sides of the component waveguide 23. Further, the different perimeters defined by different isolation trenches 49 can be combined to define or form a combination perimeter. The combination perimeter is the outermost perimeter resulting from combining the perimeters that are each partially defined by one or more of the isolation trenches 49. The isolation trenches 49 can be formed so the combination perimeter surrounds the active component.

Isolation trenches 49 are illustrated in the active components of FIG. 1G, FIG. 2, and FIG. 3. The isolation trenches 49 in each of these active components each extends through both the active medium and the light-transmitting medium 18. For instance, the walls of each isolation trench 49 are defined by both the active medium and the light-transmitting medium 18. The illustrated isolation trenches 49 extend through the seed portion 34 of the light-transmitting medium 18. Additionally, the isolation trenches 49 extend down to the base 20. For instance, the bottom of the isolation trenches 49 is defined by the optical insulator 28 that serves to define the bottom of the waveguide 16 and the component waveguide 23. Although not illustrated, the isolation trenches 49 can extend into the base 20. In particular, the isolation trenches 49 can extend into the optical insulator 28 or into the substrate 29.

The location of the trench in the active components of FIG. 1G, FIG. 2, and FIG. 3 is shown in FIG. 1B. Each isolation trench 49 terminates at different portions of the waveguide 16 such that each isolation trench 49 and the waveguide 16 together form a perimeter that surrounds a portion of the active component. For instance, each isolation trench 49 and the waveguide 16 together form a perimeter that surrounds a portion of the active medium included in the active component. Each isolation trench 49 and the waveguide 16 together form a perimeter that surrounds a portion of the active medium that includes a slab region of the active medium.

The active components each include two isolation trenches 49 that each acts with the waveguide 16 to form a perimeter that surrounds a portion of the active medium. Accordingly, two perimeters are formed on the device. When considered together, the two perimeters define a combined perimeter. For instance, the outermost perimeter of the combined perimeters proves a combined perimeter. The combined perimeter surrounds the active component. Accordingly, the isolation trenches 49 and the waveguide 16 together form or define a perimeter that surrounds the active component.

The isolation trenches 49 in FIG. 1B is shown terminating at the portion of the waveguide 16 defined in the light-transmitting medium 18; however, the isolation trenches 49 can additionally or alternately terminate at the component waveguide 23.

Figure 4E:
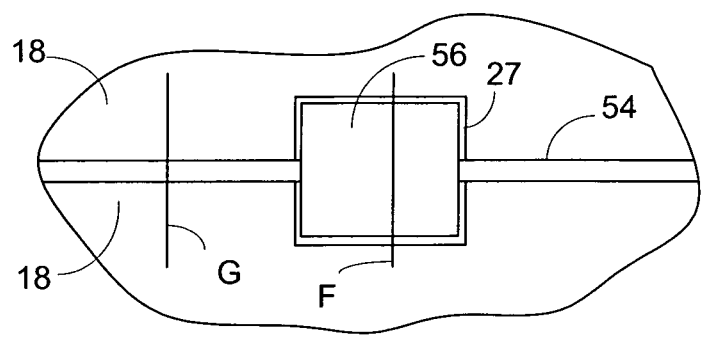
FIG. 4A through FIG. 4P illustrate a method of fabricating an active component having isolation trenches.
Figure 4F:
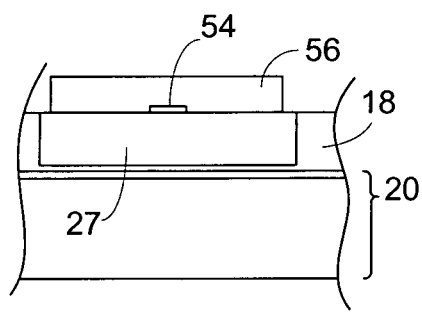
Figure 4G:
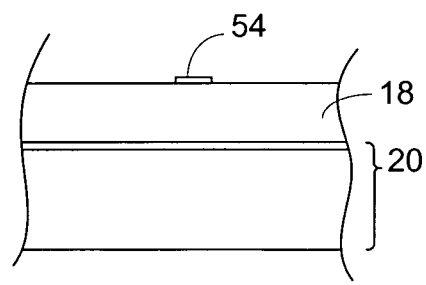
Figure 4H:
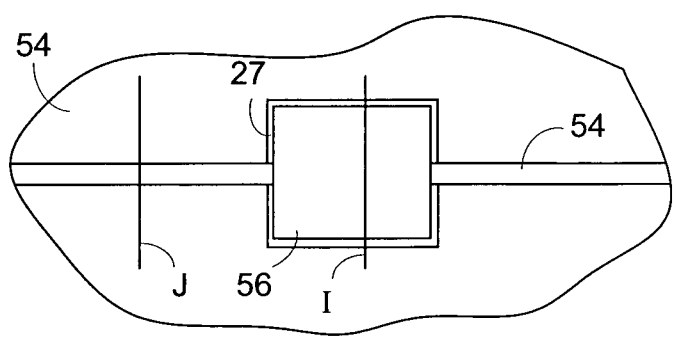
Figure 4I:
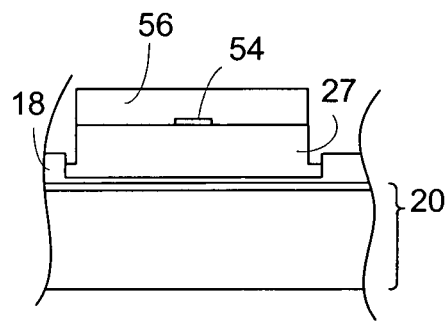
Figure 4J:
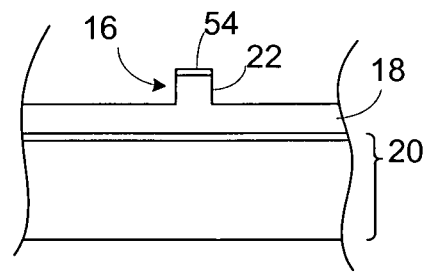
Figure 4K:
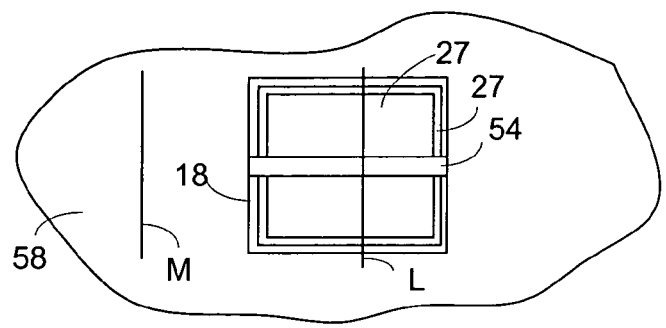
Figure 4L:
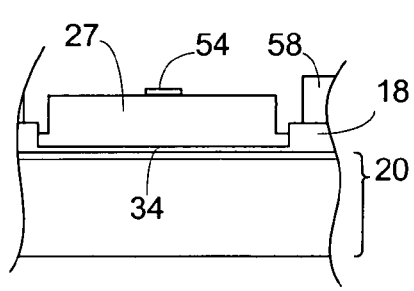
Figure 4M:
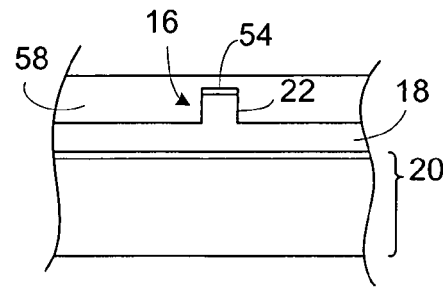
Figure 4N:
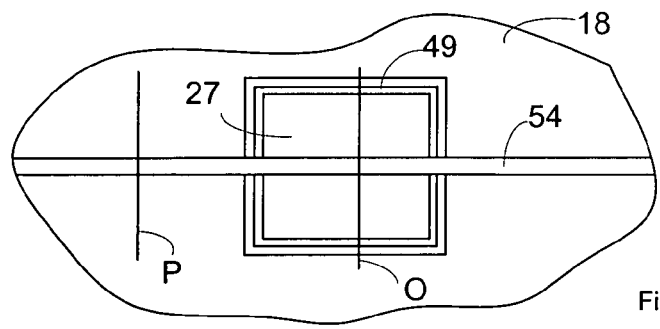
Figure 4O:
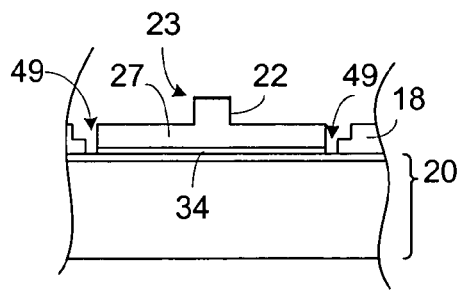
Figure 4P:
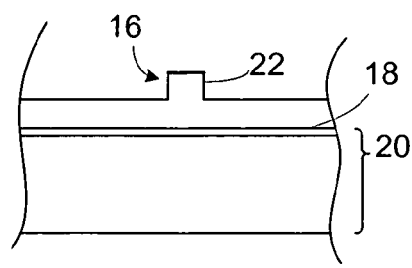

FIG. 4A through FIG. 4P illustrate a method of fabricating an active component having isolation trenches 49. The method is illustrated using a silicon-on-insulator wafer or chip as the starting precursor for the optical device. However, the method can be adapted to platforms other than the silicon-on-insulator platform.

FIG. 4A illustrate a first mask 50 formed on a silicon-on-insulator wafer or chip to provide a device precursor. FIG. 4A is a cross-section of the device precursor. The first mask 50 leaves exposed a region of the device precursor where an active cavity 52 is to be formed while the remainder of the illustrated portion of the device precursor is protected. The active cavity 52 is the region of the device precursor where the active medium 27 will be formed. A first etch is then performed so as to form the active cavity 52. The first etch yields the device precursor of FIG. 3A. The first etch is performed such that the seed portion 34 of the light-transmitting medium 18 remains on the base 20. Accordingly, the first etch is terminated before the base 20 is reached.

As noted in the discussion of FIG. 2, the active component can include an n-type first doped zone 46 and the p-type first doped zone 46 in the seed portion of the light-transmitting medium 18. FIG. 4B illustrates the formation of these first doped zones 46. The n-type first doped zone 46 and the p-type first doped zone 46 are serially formed in the light-transmitting medium 18 at the bottom of the active cavity 52 to provide the device precursor of FIG. 4B. Suitable methods of forming the first doped zones 46 include, but are not limited to, dopant implantation. The n-type first doped zone 46 can be masked during the formation of the p-type first doped zone and the p-type first doped zone 46 can be masked during the formation of the n-type first doped zone. As illustrated by the arrow labeled A in FIG. 4B, the direction of the dopant implantation during the formation of the first doped zones 46 can be substantially perpendicular to the surface of the light-transmitting medium 18 at the bottom of the active cavity 52.

In some instances, the device precursor is annealed after the formation of the first doped zones 46. A suitable annealing temperature includes temperatures greater than 950° C., 1000° C., or 1050° C. and/or less than 1100° C., 1150° C., or 1200° C.

FIG. 4C through FIG. 4P do not show the first doped zones 46 because the first doped zones 46 are not present in the active component of FIG. 1G and FIG. 3. However, the steps discussed in the context of FIG. 4C through FIG. 4P can be performed using the device precursor of FIG. 4B in order to achieve an active component according to FIG. 2.

The first mask 50 is removed and the active medium 27 is formed in the active cavity 52 of FIG. 4A or FIG. 4B so as to provide the device precursor of FIG. 4C. When the light-transmitting medium 18 is silicon and the active medium 27 is germanium or germanium-silicon, the active absorption medium 27 can be grown on the seed portion 34 of the light-transmitting medium 18.

After formation of the active medium 27, the first mask 50 can be removed and the device precursor can be planarized. Suitable planarization methods include, but are not limited to, a chemical-mechanical polishing (CMP) process.

A second mask 54 can be formed on the device precursor as shown on the device precursor of FIG. 4D. The second mask protects the location where the ridge 22 of the waveguide 16 is to be formed on the device including the location of the component waveguide 23 and the device waveguide. The remainder of the device is left exposed.

A third mask 56 is formed on the device precursor of FIG. 4D so as to provide the device precursor of FIG. 4E through FIG. 4G. FIG. 4E is a topview of the device. FIG. 4F is a cross section of the device precursor shown in FIG. 4E taken along the line labeled F and FIG. 4G is a cross section of the device precursor shown in FIG. 4E taken along the line labeled G. The third mask 56 is formed over the second mask 54. The third mask 56 protects the location of the active medium where the slab regions are to be formed in the active medium; however, the third mask 56 leaves exposed the regions where the isolation trenches 49 are to be formed.

A waveguide etch is performed on the device precursor of FIG. 4E so as to provide the device precursor of FIG. 4H through FIG. 4J. FIG. 4I is a cross section of the device precursor shown in FIG. 4H taken along the line labeled I and FIG. 4J is a cross section of the device precursor shown in FIG. 4H taken along the line labeled J. The waveguide etch forms the slab regions in the light-transmitting medium 18. As a result, the waveguide etch is performed so as to etch the light-transmitting medium 18 such that the slab regions have the desired thickness. For instance, the waveguide etch is performed so as to provide the ridge 22 of the light-transmitting medium 18 with the desired height as shown in FIG. 4J. The waveguide etch can be selected to etch the active medium faster than the light-transmitting medium 18. As a result, the exposed active medium is etched more deeply than the light-transmitting medium 18 as shown in FIG. 4I. As will become evident below, the location of the exposed active medium will become the location of the isolation trenches 49. Accordingly, the exposed active medium serves as a trench precursor.

The third mask 56 is removed from the device precursor of FIG. 4H through FIG. 4J and a fourth mask 58 is formed so as to provide the device precursor of FIG. 4K through FIG. 4M. FIG. 4L is a cross section of the device precursor shown in FIG. 4K taken along the line labeled L and FIG. 4M is a cross section of the device precursor shown in FIG. 4K taken along the line labeled M. The fourth mask 58 protects the slab regions of the light-transmitting medium 18 that have already been etched to the desired thickness. The fourth mask 58 leaves exposed the locations where the slab regions are to be formed in the active medium while the second mask 54 continues to protect the region where the component waveguide 23 is to be formed. The fourth mask 58 and the second mask 54 leave the trench precursor exposed. Because precise alignment of a mask with features on the device precursor is not possible, the edge of the fourth mask 58 is shown as being spaced back from the edge of the light-transmitting medium 18. Accordingly, a region of the light-transmitting medium 18 that is located next to the trench precursor remains exposed. A suitable fourth mask 58 includes, but is not limited to, a photoresist, silicon dioxide, and silicon nitride.

A component waveguide etch is performed on the device precursor of FIG. 4K through FIG. 4M and then both the second mask 54 and the fourth mask 58 are removed to provide the device precursor of FIG. 4N through FIG. 4P. FIG. 4O is a cross section of the device precursor shown in FIG. 4N taken along the line labeled O and FIG. 4P is a cross section of the device precursor shown in FIG. 4N taken along the line labeled N. The component waveguide etch forms the slab regions in the active medium. As a result, the component waveguide etch is performed so as to provide the slab regions of the active medium with the desired thickness. For instance, the component waveguide etch is performed so as to provide the ridge 22 of the active medium with the desired height as shown in FIG. 4O. Additionally, the exposed trench precursor is further etched so as to complete the formation of the isolation trench 49. The isolation trench 49 is shown extending through the seed portion of the light-transmitting medium 18 down to the base 20 but may extend only to or into the seed portion of the light-transmitting medium 18 depending on the duration of the component waveguide etch. Alternately, the isolation trench 49 may extend part way into the base 20 depending on the duration of the component waveguide etch.

Other etches can be introduced into the method of FIG. 4A through FIG. 4P. FIG. 5A through FIG. 5L illustrate a method where a supplemental etch is introduced into the method of FIG. 4A through FIG. 4P in order to form the recesses 25 shown in FIG. 1B.

Figure 5A:
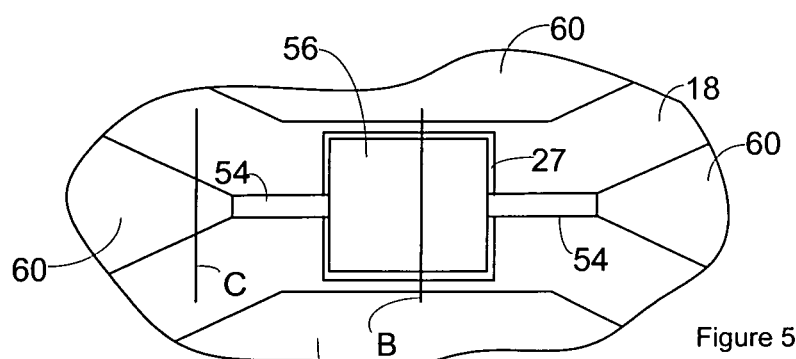
FIG. 5A through FIG. 5L illustrate a method where a supplemental etch is introduced into the method of FIG. 4A through FIG. 4P in order to form the recesses 25 shown in FIG. 1B.
Figure 5B:
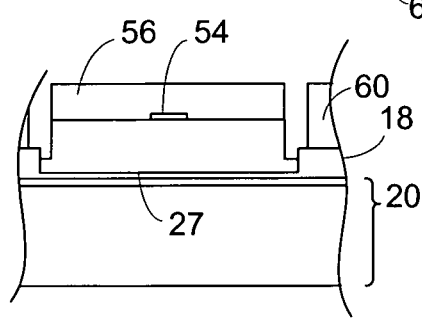
Figure 5C:
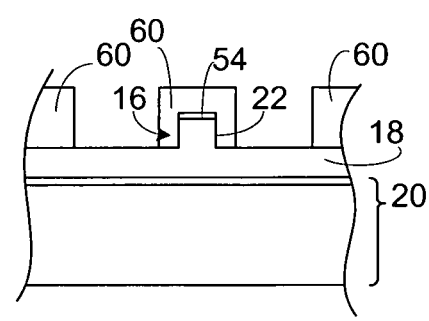

A fifth mask 60 is formed on the device precursor of FIG. 4H through FIG. 4J so as to form the device precursor of FIG. 5A through FIG. 5C. FIG. 5A is a topview of the device precursor. FIG. 5B is a cross section of the device precursor shown in FIG. 5A taken along the line labeled B and FIG. 5C is a cross section of the device precursor shown in FIG. 5A taken along the line labeled C. The fifth mask 60 is formed over the second mask 54 so the trench precursors and the regions where the recesses 25 are to be formed remain exposed. Additionally, the fifth mask 60 is spaced apart from the edge of the trench precursor. As a result, a portion of the light-transmitting medium 18 next to the trench precursor remains exposed. The second mask 54, the third mask 56 and the fifth mask 60 protect the remainder of the device precursor.

Figure 5D:
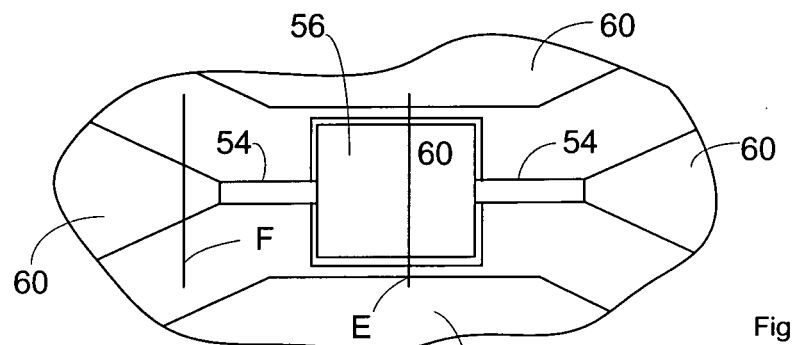
Figure 5E:
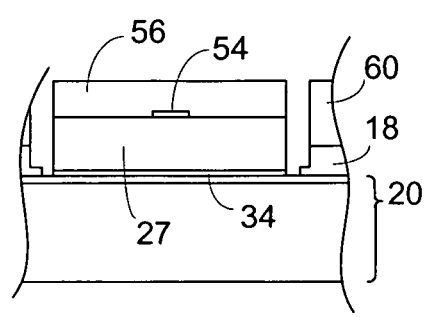
Figure 5F:
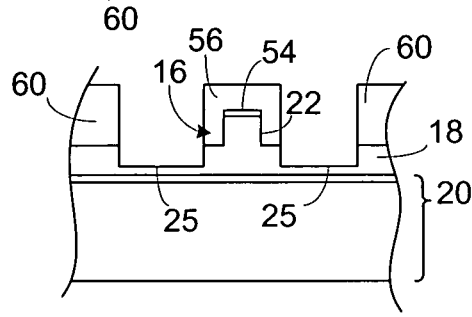

A recess etch is performed on the device precursor of FIG. 5A through FIG. 5C so as to provide the device precursor of FIG. 5D through FIG. 5F. FIG. 5D is a topview of the device precursor. FIG. 5E is a cross section of the device precursor shown in FIG. 5D taken along the line labeled E and FIG. 5F is a cross section of the device precursor shown in FIG. 5D taken along the line labeled F. Since the recess etch forms the recesses 25, the recess etch is performed for a duration that provides the recesses 25 with the desired depth. Additionally, the exposed trench precursor is further etched and may complete the formation of the isolation trench 49 depending on the duration of the recess etch and/or on the ratio of etch rates of active medium to light-transmitting medium 18.

Figure 5G:
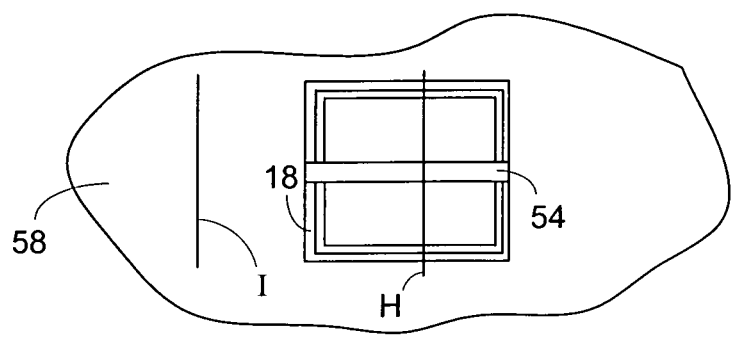
Figure 5H:
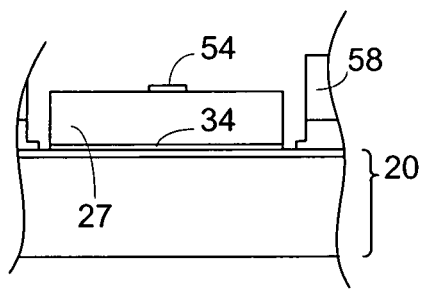
Figure 5I:
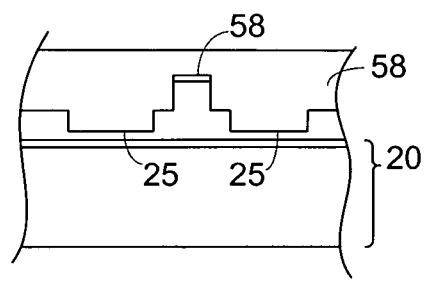

The fifth mask 60 and the third mask 56 are removed from the device precursor of FIG. 5D through FIG. 5F and the fourth mask 58 is formed on the device precursor so as to form the device precursor of FIG. 5G through FIG. 5I. FIG. 5G is a topview of the device precursor. FIG. 5H is a cross section of the device precursor shown in FIG. 5G taken along the line labeled H and FIG. 5I is a cross section of the device precursor shown in FIG. 5G taken along the line labeled I. The fourth mask 58 protects the recesses 25 and the slab regions of the light-transmitting medium 18 that have already been etched to the desired thickness. The fourth mask 58 leaves exposed the locations where the slab regions are to be formed in the active medium while the second mask 54 continues to protect the region where the component waveguide 23 is to be formed. The fourth mask 58 and the second mask 54 leave the trench precursor exposed. Because precise alignment of a mask with features on the device precursor is not always possible, the edge of the fourth mask 58 is shown as being spaced back from the edge of the light-transmitting medium 18. Accordingly, a region of the light-transmitting medium 18 that is located next to the trench precursor remains exposed. A suitable fourth mask 58 includes, but is not limited to, a photoresist, silicon dioxide, and silicon nitride.

Figure 5J:
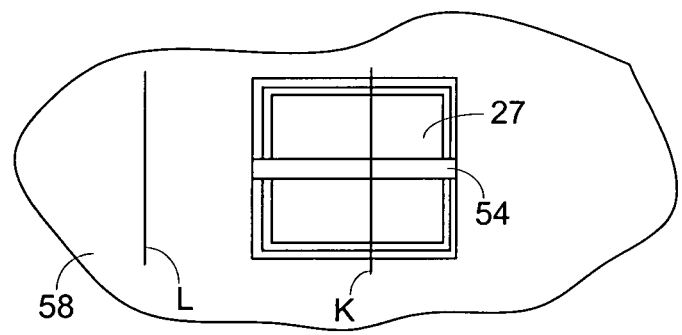
Figure 5K:
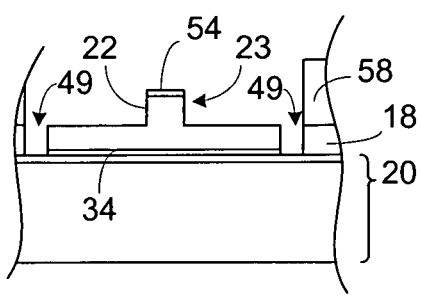
Figure 5L:
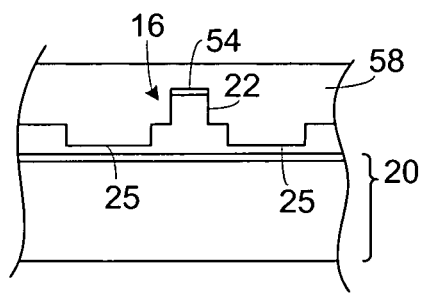

The component waveguide etch is performed on the device precursor of FIG. 5G through FIG. 5I to provide the device precursor of FIG. 5J through FIG. 5L. FIG. 5J is a topview of the device precursor. FIG. 5K is a cross section of the device precursor shown in FIG. 5J taken along the line labeled K and FIG. 5L is a cross section of the device precursor shown in FIG. 5J taken along the line labeled L. The component waveguide etch forms the slab regions in the active medium. As a result, the component waveguide etch is performed so as to provide the slab regions of the active medium with the desired thickness. For instance, the component waveguide etch is performed so as to provide the ridge 22 of the active medium with the desired height as shown in FIG. 5K. Additionally, the exposed trench precursor is further etched and if not etched to the desired depth during the recess etch, may be etched to the desired etch by the component waveguide etch. The isolation trench 49 is shown extending through the seed portion of the light-transmitting medium 18 down to the base 20 but may extend only to or into the seed portion of the light-transmitting medium 18 depending on the duration of the component waveguide 23. Alternately, the isolation trench 49 may extend part way into the base 20 depending on the duration of the component waveguide etch.

In some instances, it may be desirable for the outer side of the isolation trench 49 to be defined by a wall. FIG. 6A through FIG. 6I illustrate a method for forming the isolation trench 49 such that a recess is formed adjacent to an isolation trench 49 so as to form a wall that defines a side of the isolation trench 49.

Figure 6A:
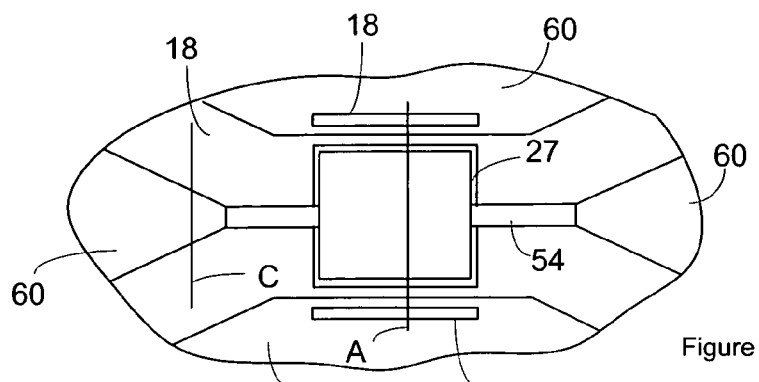
FIG. 6A through FIG. 6I illustrate a method for forming the isolation trench such that a wall that defines a side of the isolation trench.
Figure 6B:
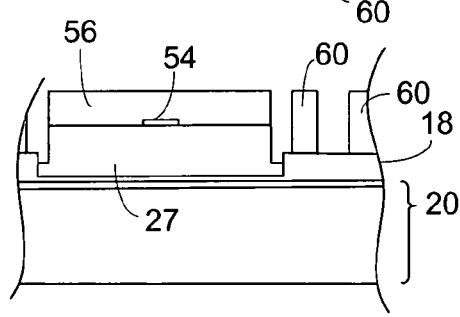
Figure 6C:
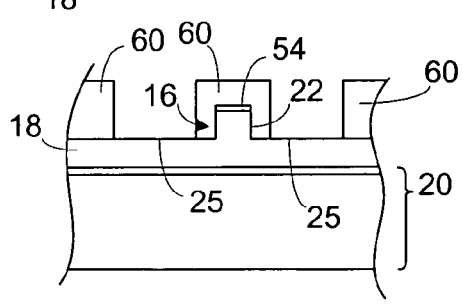

A fifth mask 60 is formed on the device precursor of FIG. 4H through FIG. 4J so as to form the device precursor of FIG. 6A through FIG. 6I. FIG. 6A is a topview of the device precursor. FIG. 6B is a cross section of the device precursor shown in FIG. 6A taken along the line labeled B and FIG. 6C is a cross section of the device precursor shown in FIG. 6A taken along the line labeled C. The fifth mask 60 is formed over the second mask 54 so the trench precursors and the regions where the recesses 25 are to be formed remain exposed. Additionally, regions where wall recesses are to be formed adjacent to the isolation trenches 49 also remain exposed. The fifth mask 60 is spaced apart from the edge of the trench precursor. As a result, a portion of the light-transmitting medium 18 next to the trench precursor remains exposed. The second mask 54, third mask 56 and the fifth mask 60 protect the remainder of the device precursor.

Figure 6D:
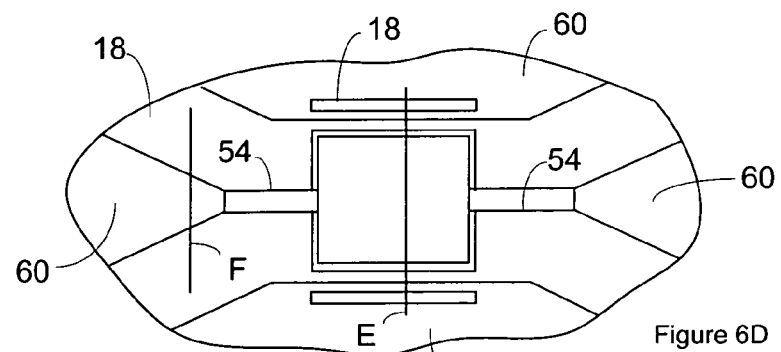
Figure 6E:
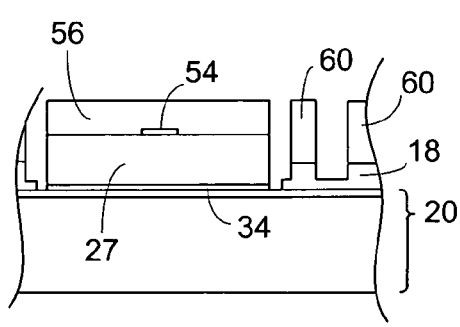
Figure 6F:
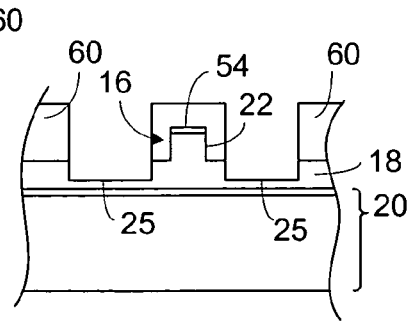

The recess etch is performed on the device precursor of FIG. 6A through FIG. 6C so as to provide the device precursor of FIG. 6D through FIG. 6F. FIG. 6D is a topview of the device precursor. FIG. 6E is a cross section of the device precursor shown in FIG. 6D taken along the line labeled E and FIG. 6F is a cross section of the device precursor shown in FIG. 6D taken along the line labeled F. Since the recess etch forms the recesses, the recess etch is performed for a duration that provides the recesses with the desired depth as shown in FIG. 6F. The recess etch also forms the wall recesses in the light-transmitting medium 18. As a result, the wall recesses are also formed to the depth of the recesses as shown in FIG. 6E. As is also evident from FIG. 6E, the recess etch further etches the exposed trench precursor and may complete the formation of the isolation trench 49 depending on the duration of the recess etch and/or on the ratio of etch rates of active medium to light-transmitting medium 18.

Figure 6G:
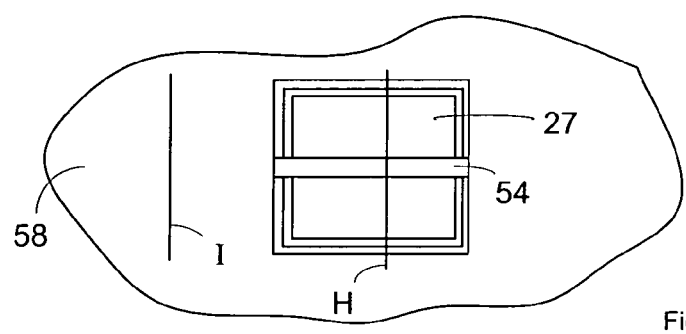
Figure 6H:
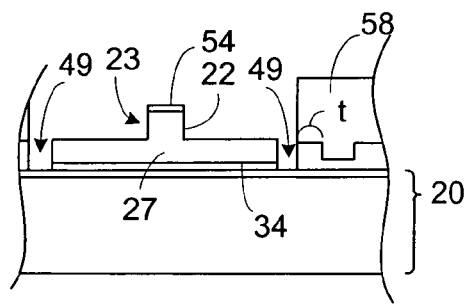
Figure 6I:
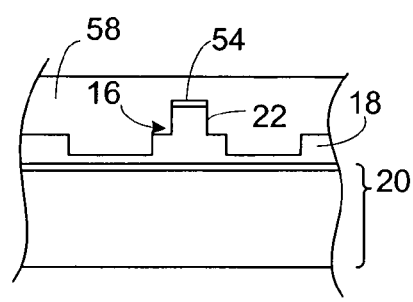

The fifth mask 60 and the third mask 56 are removed from the device precursor of FIG. 6D through FIG. 6F and the fourth mask 58 is formed on the device precursor. The component waveguide etch is performed on the result so as to form the device precursor of FIG. 6G through FIG. 6I. FIG. 6G is a topview of the device precursor. FIG. 6H is a cross section of the device precursor shown in FIG. 6G taken along the line labeled H and FIG. 6I is a cross section of the device precursor shown in FIG. 6G taken along the line labeled I. The fourth mask 58 protects the recesses, wall recesses and the slab regions of the light-transmitting medium 18 that have already been etched to the desired thickness. The fourth mask 58 leaves exposed the locations where the slab regions are to be formed in the active medium while the second mask 54 continues to protect the region where the component waveguide 23 is to be formed. The fourth mask 58 and the second mask 54 leave the trench precursor exposed. Because precise alignment of a mask with features on the device precursor is not always possible, the edge of the fourth mask 58 is shown as being spaced back from the edge of the light-transmitting medium 18. Accordingly, a region of the light-transmitting medium 18 that is located next to the trench precursor remains exposed.

The component waveguide etch forms the slab regions in the active medium. As a result, the component waveguide etch is performed so as to provide the slab regions of the active medium with the desired thickness. For instance, the component waveguide etch is performed so as to provide the ridge 22 of the active medium with the desired height as shown in FIG. 6H. Additionally, the exposed trench precursor is further etched and if not etched to the desired depth during the recess etch, may be etched to the desired etch by the component waveguide etch. The isolation trench 49 is shown extending through the seed portion of the light-transmitting medium 18 down to the base 20 but may extend only to or into the seed portion of the light-transmitting medium 18 depending on the duration of the component waveguide etch. Alternately, the isolation trench 49 may extend part way into the base 20 depending on the duration of the component waveguide etch.

The method of FIG. 6A through FIG. 6I may be more tolerant of process variations that other methods. The walls have a thickness labeled t in FIG. 6H. In some instances, the wall thickness is less than 1, 0.5, or 0.3 μm.

As is evident from FIG. 5L and FIG. 6I, the recess etch provides the device with the second structure shown in FIG. 1D. The waveguide structure of FIG. 5L, FIG. 6I, and FIG. 1D is useful for curved waveguide and sharply curved waveguides. In particular, this waveguide structure can reduce the optical loss that is often associated with curved waveguides. Accordingly, the method of forming these recesses next to the waveguide 16 as disclosed in FIG. 5A to FIG. 6I can also be used to form these recesses next to curved waveguides concurrently with the formation of the active component. The formation of these recesses next to curved waveguides can be in addition to forming them next to the waveguide 16 shown above or as an alternative to forming them next to the waveguide 16 shown above.

The doped regions 40 can be formed on the device precursor of FIG. 4N through FIG. 4O as discussed in the context of FIG. 1G, FIG. 2, or FIG. 3. The second mask 54 and the fourth mask 58 can be removed from the device precursors of FIG. 5J through FIG. 5L or FIG. 6G through FIG. 6I before forming the regions 40 discussed in the context of FIG. 1G, FIG. 2, or FIG. 3. In some instances, it may be desirable to leave the second mask 54 and/or the fourth mask 58 in place during the formation of the doped regions. Accordingly, the doped regions may be fully or partially formed before removal of the second mask 54 and/or the fourth mask 58. The doped regions can be formed using traditional integrated circuit fabrication technologies including deposition, and ion-implantation. Additional details regarding the formation of the doped regions can be found in U.S. patent application Ser. Nos. 13/385,099 and 13/385,372.

After formation of the doped regions and removal of the second mask 54 and the fourth mask 58, the electrical conductors 44 can be formed using traditional integrated circuit fabrication technologies.

As is evident from the above methods, the isolation trench 49 is formed as a result of both the component waveguide etch and the waveguide etch; however, the isolation trenches 49 can be formed as a result of only the waveguide etch. For instance, the waveguide etch can be selected to have an etch rate preference ratio (ratio of etch rate of active medium to light-transmitting medium 18) that is sufficiently high that the isolation trench 49 is formed to the desired depth during the waveguide etch. In these instances, it may not be necessary for the isolation trench 49 to be exposed during the component waveguide etch.

The method of FIG. 4A through FIG. 4P shows the isolation trenches 49 terminating at the component waveguide 23; however, the isolation trenches 49 can terminate at both the component waveguide 23 and the waveguide 16 or only the waveguide 16 depending on the type, etch rate preference ratio, and duration of etches. For instance, the isolation trench 49 of FIG. 5K is shown terminating at the interface of the component waveguide 23 and the waveguide 16.

A suitable first mask 50 includes, but is not limited to, a hard mask such as a silica mask, silicon nitride, and polyimide. A suitable second mask 54 includes, but is not limited to, a hard mask such as a silica mask, silicon nitride, and polyimide. A suitable third mask 56 includes, but is not limited to, a photoresist, silica, and silicon nitride. A suitable fourth mask 58 includes, but is not limited to, a photoresist, silica, and silicon nitride. A suitable fifth mask 60 includes, but is not limited to, a photoresist, silica, and silicon nitride.

The width of the bottom of an isolation trench 49 is labeled $W_{IT}$ in FIG. 3. In some instances, any of the above embodiments have the isolation trenches 49 constructed such that, the width of the isolation trench 49 ($W_{IT}$) can be greater than 0.2, 0.3, or 0.4 and/or less than 0.6, 0.7, or 0.8.

Although the above description describes masks using numerical identifiers such as first, second, third, etc., these identifiers denote different masks and not sequence. For instance, the fourth mask 58 may be used before the fifth mask 60. Further, the steps described above can be performed in a different sequence than is described. For instance, the component waveguide etch can be performed before the waveguide etch. This sequence would result in the fourth mask 58 being place on the device precursor and then removed before the third mask 56 is placed on the device precursor.

A suitable first etch includes, but is not limited to, a dry etch. A suitable waveguide etch includes, but is not limited to, a dry etch. A suitable component waveguide etch includes, but is not limited to, a dry etch. A suitable recess etch includes, but is not limited to, a dry etch. In many cases, it is desirable for the waveguide etch and/or the recess etch to etch the active medium at a faster rate than the light-transmitting medium 18. This preference of the waveguide etch for the active medium can permit the isolation trenches 49 to extend deeper into the device and can accordingly enhance the degree of thermal, electrical, and/or optical isolation provided by the isolation trenches 49. When the active medium includes or consists of germanium or germanium-silicon and the light-transmitting medium 18 includes or consists of silicon, an example of a dry etch that etches the active medium more quickly than the light-transmitting medium 18 includes a DRIE (Deep Reactive Ion) etch such as an isotropic plasma etch with sulfur hexafluoride [$SF_6$] alternating with octafluorocyclobutane [$C_4F_8$] passivation layer deposition in accordance with the Bosch process.

Although the above discussion discloses isolation trenches 49 on opposing sides of the waveguide 16, it may be desirable to have one or more isolation trenches 49 on only one side of the waveguide 16. As a result, in some instances, the device can include an active component having one or more isolation trenches 49 positioned on a single side of the waveguide 16 and no isolation trenches 49 positioned on the opposing side of the waveguide 16. Such a configuration may be useful when the active component is positioned adjacent to an edge of the device. Additionally or alternatively, each of the above isolation trenches 49 is shown terminating at two different locations on the waveguide 16. However, it may be desirable for an isolation trench 49 to terminate at only one location on a waveguide 16 and for the other end of the isolation trench 49 to be positioned away from the waveguide 16 and/or for one or more isolation trenches 49 to be constructed without any ends terminating at a waveguide 16.

The perimeters shown above are formed by a single continuous isolation trench in combination with the waveguide. In contrast, an isolation trenches can act with the waveguide to define the perimeter. For instance, the isolation trench need not terminate at the waveguide but when considered together with the waveguide can provide an outline of the perimeter. As another example, multiple isolation trenches can define a perimeter. For instance, the isolation trenches illustrated above can be broken up into smaller trenches that when considered together (stitched together) define the same perimeter as is formed by the isolation trenches shown above.

Although the above disclosure shows the isolation trenches being filled with a gas such as air, solids and/or liquids can be positioned in one or more of the isolation trenches or can fill one or more of the isolation trenches. For instance, a cladding material such silica can be positioned in one or more of the isolation trenches.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
    an active component on a base and having at least one functionality selected from a group consisting of light sensor functionality and light modulator functionality,
        the active component including an active medium, the active medium including slab regions and a ridge extending upwards from the base, the ridge of the active medium extending upwards from the slab regions of the active medium and such that the ridge is positioned between the slab regions of the active medium,
        the ridge of the active medium defining a portion of a waveguide on the base, the waveguide being configured to guide a light signal through the ridge of the active medium; and
    isolation trenches extending into the slab regions of the active medium and being spaced apart from the ridge of the active medium.

2. The device of claim 1, wherein the isolation trenches and the waveguide together define a perimeter that surrounds a portion of the active component.

3. The device of claim 2, wherein the perimeter surrounds a portion of a slab region of the active medium.

4. The device of claim 1, wherein the one or more of the isolation trenches each terminates at two different locations on the waveguide and such that the isolation trenches and the waveguide together define a perimeter that surrounds a portion of a slab region of the active medium.

5. The device of claim 4, wherein the one or more isolation trenches extend through the active medium.

6. The device of claim 1, wherein a first one of the one or more of the isolation trenches terminates at two different locations on the waveguide,
    the first isolation trench and the waveguide together define a first perimeter that surrounds a portion of a first one of the slab regions of the active medium,
    a second one of the one or more of the isolation trenches terminates at two different locations on the waveguide, and
    the second isolation trench and the waveguide together define a second perimeter that surrounds a portion of a second one of the slab regions of the active medium.

7. The device of claim 6, wherein the first isolation trench and the waveguide form the first perimeter and the second isolation trench and the waveguide form the second perimeter.

8. The device of claim 7, wherein the first isolation trench and the second isolation trench extend through the active medium.

9. The device of claim 8, further comprising a light-transmitting medium positioned on the base, the light-transmitting region including a ridge, slab regions, and an underlying portion,
    the ridge of the light-transmitting medium extending upwards from the base and being located between the slab regions of the light-transmitting medium,
    the underlying portion of the light transmitting medium being located between the active medium and the base, and
    the first isolation trench and the second isolation trench each extends through the underlying portion of the light-transmitting medium.

10. The device of claim 9, wherein the first perimeter and the second perimeter are on opposing sides of the ridge of the active medium and the first perimeter and the second perimeter combine to form a combination perimeter that surrounds the active component.

11. The device of claim 1, wherein the active medium included in the ridge of the active medium is continuous with the active medium included in the slab regions of the active medium.

12. The device of claim 11, wherein the slab regions of the active medium contact the ridge of the active medium.

13. A method, comprising:
    performing a device waveguide etch on a device having a light transmitting-medium on a base, the device waveguide etch defining a device waveguide in the light-transmitting medium;
    performing a component waveguide etch on the device so as to etch an active medium on the device, the second etch defining a portion of a component waveguide on the device, the device waveguide and the component waveguide being aligned so as to be different portions of a common waveguide in which the device waveguide portion exchanges light signals with the component waveguide portion; and
    forming on the device isolation trenches that each extends into the active medium and are spaced apart from the ridge of the active medium,
        the one or more isolation trenches being fully or partially formed by one or more etches selected from the device waveguide etch and the component waveguide etch.

14. The method of claim 13, wherein the isolation trenches and the waveguide together define a perimeter that surrounds at least a portion of an active component having at least one functionality selected from a group consisting of light sensor functionality and light modulator functionality.

15. The method of claim 14, wherein the isolation trenches are formed by both the device waveguide etch and the component waveguide etch.

16. The method of claim 13, wherein performing the device waveguide etch includes concurrently etching both the active medium and the light-transmitting medium and etching the active medium at least two times faster than the light-transmitting medium.

17. The method of claim 13, wherein performing the device waveguide etch includes forming a ridge of the light-transmitting medium between slab regions of the light-transmitting medium and performing the component waveguide etch includes forming a ridge of the active medium between slab regions of the active medium.

18. The method of claim 17, wherein the same mask defines the ridge of the active medium during the component waveguide etch as defines the ridge of the light-transmitting medium during the device waveguide etch.

19. The method of claim 17, wherein the perimeter surrounds a portion of a slab region of the active medium.

20. The method of claim 17, wherein the one or more of the isolation trenches each terminates at two different locations on the waveguide such that the isolation trenches and the waveguide together form a perimeter that surrounds a portion of one of the slab regions of the active medium.

21. The method of claim 17, wherein a first one of the one or more of the isolation trenches terminates at two different locations on the waveguide,
the first isolation trench and the waveguide together define a first perimeter that surrounds a portion of a first one of the slab regions of the active medium,
a second one of the one or more of the isolation trenches terminates at two different locations on the waveguide, the second isolation trench and the waveguide together define a second perimeter that surrounds a portion of a second one of the slab regions of the active medium, and
the first isolation trench and the second isolation trench extend through the active medium.

22. The method of claim 21, further comprising a light-transmitting medium positioned on the base, the light-transmitting region including a ridge, slab regions, and an underlying portion,
the ridge of the light-transmitting medium extending upwards from the base and being located between the slab regions of the light-transmitting medium,
the underlying portion of the light transmitting medium being located between the active medium and the base, and
wherein the first isolation trench and the second isolation trench each extends through the underlying portion of the light-transmitting medium.

23. The method of claim 13, wherein
performing the component waveguide etch includes forming a ridge of the active medium between slab regions of the active medium, and
the isolation trenches extends into slab regions of the active medium and are spaced apart from the ridge of the active medium.

* * * * *